United States Patent
Miller et al.

(10) Patent No.: US 10,403,785 B2
(45) Date of Patent: Sep. 3, 2019

(54) WAVELENGTH CONVERTING MATERIAL DEPOSITION METHODS AND ASSOCIATED ARTICLES

(71) Applicant: Luminus Devices, Inc., Woburn, MA (US)

(72) Inventors: Harris Miller, Sharon, MA (US); Scott W. Duncan, Andover, MA (US); Budhadipta Dan, Medford, MA (US)

(73) Assignee: Luminus Devices, Inc., Woburn, MA (US)

( * ) Notice: Subject to any disclaimer, the term of this patent is extended or adjusted under 35 U.S.C. 154(b) by 0 days.

(21) Appl. No.: 14/867,952

(22) Filed: Sep. 28, 2015

(65) Prior Publication Data

US 2016/0155890 A1    Jun. 2, 2016

Related U.S. Application Data

(63) Continuation of application No. 13/593,746, filed on Aug. 24, 2012, now Pat. No. 9,147,816.

(51) Int. Cl.

| | | |
|---|---|---|
| *H01L 33/00* | (2010.01) | |
| *H01L 33/50* | (2010.01) | |
| *H01L 33/38* | (2010.01) | |
| *H01L 33/48* | (2010.01) | |
| *H01L 33/44* | (2010.01) | |
| *H01L 33/56* | (2010.01) | |

(52) U.S. Cl.
CPC ........... *H01L 33/005* (2013.01); *H01L 33/50* (2013.01); *H01L 33/502* (2013.01); *H01L 33/505* (2013.01); *H01L 33/508* (2013.01); *H01L 33/38* (2013.01); *H01L 33/44* (2013.01); *H01L 33/48* (2013.01); *H01L 33/504* (2013.01); *H01L 33/507* (2013.01); *H01L 33/56* (2013.01); *H01L 2933/0041* (2013.01); *H01L 2933/0083* (2013.01)

(58) Field of Classification Search
CPC ....... H01L 33/38; H01L 33/50; H01L 33/502; H01L 33/505; H01L 33/508; H01L 2933/0041; H01L 2933/0083; H01L 33/44; H01L 33/48; H01L 33/507; H01L 33/56

See application file for complete search history.

(56) References Cited

U.S. PATENT DOCUMENTS

| | | |
|---|---|---|
| 6,831,302 B2 | 12/2004 | Erchak et al. |
| 7,084,434 B2 | 8/2006 | Erchak et al. |
| 7,196,354 B1 | 3/2007 | Erchak et al. |
| 7,262,550 B2 | 8/2007 | Erchak et al. |
| 7,781,779 B2 * | 8/2010 | Nemchuk ............. H01L 33/508 257/102 |
| 7,906,352 B2 | 3/2011 | Brunner et al. |

(Continued)

OTHER PUBLICATIONS

International Search Report & Written Opinion from PCT/US2013/056408, dated Mar. 5, 2014.

(Continued)

*Primary Examiner* — Mohsen Ahmadi

(74) *Attorney, Agent, or Firm* — Wolf, Greenfield & Sacks, P.C.

(57) ABSTRACT

Systems and methods related to the arrangement of regions containing wavelength-converting materials, and associated articles, are provided.

16 Claims, 3 Drawing Sheets

(56) References Cited

U.S. PATENT DOCUMENTS

| | | | |
|---|---|---|---|
| 8,415,698 B2* | 4/2013 | Hwang | H01L 33/54 |
| | | | 257/95 |
| 8,492,182 B2* | 7/2013 | Von Malm | H05B 33/10 |
| | | | 257/88 |
| 8,878,215 B2* | 11/2014 | Park | H01L 33/52 |
| | | | 257/98 |
| 9,070,851 B2* | 6/2015 | Seo | H01L 27/153 |
| 9,147,816 B2 | 9/2015 | Miller et al. | |
| 2005/0224812 A1 | 10/2005 | Liu et al. | |
| 2006/0157721 A1 | 7/2006 | Tran et al. | |
| 2007/0111344 A1 | 5/2007 | Leising | |
| 2008/0173884 A1 | 7/2008 | Chitnis et al. | |
| 2008/0179611 A1 | 7/2008 | Chitnis et al. | |
| 2009/0014736 A1 | 1/2009 | Ibbetson et al. | |
| 2009/0034292 A1 | 2/2009 | Pokrovskiy et al. | |
| 2009/0039375 A1 | 2/2009 | Le Toquin | |
| 2009/0057690 A1 | 3/2009 | Chakraborty | |
| 2009/0261358 A1 | 10/2009 | Chitnis et al. | |
| 2009/0309114 A1 | 12/2009 | Lu et al. | |
| 2010/0038670 A1 | 2/2010 | Panaccione et al. | |
| 2010/0055811 A1 | 3/2010 | Lin et al. | |
| 2010/0126566 A1 | 5/2010 | Ji | |
| 2010/0219767 A1 | 9/2010 | Pumyea et al. | |
| 2012/0193670 A1* | 8/2012 | Son | H01L 33/504 |
| | | | 257/99 |
| 2012/0257386 A1 | 10/2012 | Harbers et al. | |
| 2016/0260874 A1* | 9/2016 | Reiss | H01L 33/0095 |

OTHER PUBLICATIONS

Braune, B., et al., "A New Wafer Level Coating Technique to Reduce the Color distribution of LEDs", *Proc. Of SPIE*, vol. 6486, (2007).

* cited by examiner

WAVELENGTH CONVERTING MATERIAL DEPOSITION METHODS AND ASSOCIATED ARTICLES

RELATED APPLICATIONS

This Application is a continuation of U.S. application Ser. No. 13/593,746, entitled "WAVELENGTH CONVERTING MATERIAL DEPOSITION METHODS AND ASSOCIATED ARTICLES" filed on Aug. 24, 2012, which is herein incorporated by reference in its entirety.

TECHNICAL FIELD

Systems and methods related to the arrangement of wavelength-converting materials, and associated articles, are generally described.

BACKGROUND

Light-emitting diodes (LEDs) can generally provide light in a more efficient manner than incandescent and/or fluorescent light sources. The relatively high power efficiency associated with LEDs has created an interest in using LEDs to displace conventional light sources in a variety of lighting applications. For example, in some instances LEDs are being used as traffic lights and to illuminate cell phone keypads and displays.

Typically, an LED is formed of multiple layers, with at least some of the layers being formed of different materials. In general, the materials and thicknesses selected for the layers influence the wavelength(s) of light emitted by the LED. In addition, the chemical composition of the layers can be selected to promote isolation of injected electrical charge carriers into regions (e.g., quantum wells) for relatively efficient conversion to light. Generally, the layers on one side of the junction where a quantum well is grown are doped with donor atoms that result in high electron concentration (such layers are commonly referred to as n-type layers), and the layers on the opposite side are doped with acceptor atoms that result in a relatively high hole concentration (such layers are commonly referred to as p-type layers).

LEDs also generally include contact structures (also referred to as electrical contact structures or electrodes), which are conductive features of the device that may be electrically connected to a power source. The power source can provide electrical current to the device via the contact structures. For example, the contact structures can deliver current along the lengths of structures to the surface of the device within which light may be generated.

Light-emitting devices may also include a wavelength-converting region, which can include, for example, one or more phosphor materials. The wavelength-converting material (e.g., phosphor) may be in the form of, for example, particles distributed in a second material (e.g., an encapsulant or adhesive, such as epoxy) to form a composite structure. Regions comprising wavelength-converting materials can absorb light having a first wavelength from a light-generating region (e.g., semiconductor region within an LED) and emit light having a second, different wavelength. As a result, a light-emitting device incorporating a wavelength-converting region can emit light having wavelength(s) that may not be possible to produce using LEDs without such regions.

SUMMARY

Systems and methods related to the arrangement of regions containing wavelength-converting materials, and associated articles, are provided. The subject matter of the present invention involves, in some cases, interrelated products, alternative solutions to a particular problem, and/or a plurality of different uses of one or more systems and/or articles.

In one aspect, a method is described. In certain embodiments, the method comprises providing a substrate over which a mask material and a wavelength-converting material are positioned, wherein the mask material covers at least a first portion of an exterior surface of the substrate, the mask material does not cover at least a second portion of the exterior surface of the substrate, and the wavelength-converting material is positioned over the mask material and the second portion of the exterior surface of the substrate. In some embodiments, the method further comprises removing a portion of the wavelength-converting material such that wavelength-converting material is no longer positioned over at least a portion of the mask material and at least a portion of the wavelength-converting material remains positioned over the second portion of the exterior surface of the substrate. In some embodiments, the method further comprises removing at least a portion of the mask material.

In one set of embodiments, the method comprises providing a substrate over which a mask material and a wavelength-converting material are positioned, wherein the mask material covers at least a first portion of an exterior surface of the substrate, the mask material does not cover at least a second portion of the exterior surface of the substrate, and the wavelength-converting material is positioned over the mask material and the second portion of the exterior surface of the substrate. In certain embodiments, the method further comprises grinding at least a portion of the wavelength-converting material positioned over the mask material to remove at least a portion of the wavelength-converting material positioned over the mask material, and removing at least a portion of the mask material.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Figure 1A:
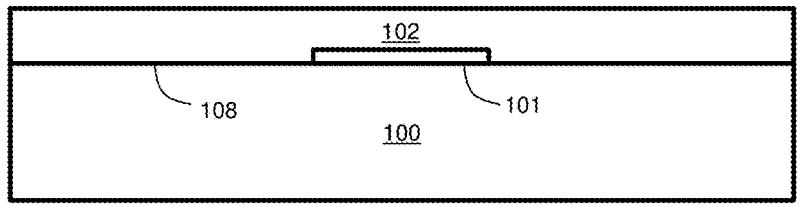
FIGS. 1A-1E are cross-sectional schematic illustrations of a process in which wavelength-converting material is arranged over a substrate, according to one set of embodiments.
Figure 1B:
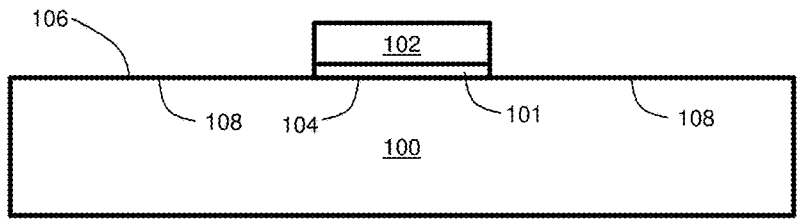

Systems and methods related to the arrangement of wavelength-converting materials, and associated articles, are generally described. In certain embodiments, wavelength-converting materials (e.g., phosphors, quantum dots, and the like) can be formed over a device (e.g., a light emitting device such as a light emitting diode) and patterned to coat only certain areas of the external surface (e.g., an emission surface) of the device. For example, the wavelength-converting material can be arranged such that it does not cover at least a portion of an electrical contact formed on a light-emitting device, but such that the wavelength-converting material covers at least a portion of the emission surface of the light-emitting device.

The strategic arrangement of wavelength-converting materials can be particularly useful in light-emitting devices. Generally, a wavelength-converting material can be used to convert the wavelength of absorbed light (e.g., light from the light-generating region of a light-emitting device) to another wavelength. For example, wavelength-converting material can function by absorbing light having a first wavelength and emitting light having a second, different wavelength than the first wavelength (e.g., a longer or shorter wavelength than the first wavelength). In this manner, light-emitting devices can emit light of wavelength(s) (and, thus, color) that may not be readily obtainable from light-emitting devices that do not include wavelength-converting regions. A variety of suitable wavelength-converting materials (e.g., phosphors, quantum dots, and the like) can be used, as described in more detail below.

The ability to arrange wavelength-converting materials over only certain areas of a light-emitting device can be useful in a variety of applications. For example, one common method of producing white light from a light-emitting device that emits non-white light involves applying a polymeric suspension of phosphor particles or other wavelength-converting material onto the emission surface of the light-emitting device. The non-white light generated by the light-emitting device can be absorbed by the wavelength-converting material, which in turn can emit white light. Generally, such devices include emission surface areas that actively generate luminance as well as other areas of the exposed surface that are covered by electrically conductive bond pads, which can be used to transport electrical current to the device. In many instances, it is desirable to only cover the areas that actively generate luminance with wavelength-converting material while leaving the electrically conductive bond pads uncovered (and, therefore, easily accessible to bond wires or other components used to make electrical connection(s) to the light-emitting device).

Deposition of wavelength-converting material can be accomplished via a variety of dispensing and coating methods, such as spray-coating, spin-coating, slot-coating, or jetting. However, patterning of the wavelength-converting material can be difficult. For example, some printing methods, such as screen-printing, are capable of patterning the deposited wavelength-converting material, but not with sufficient precision and accuracy to avoid depositing wavelength-converting material on electrically conductive bond pads. In many cases, such bond pads are 125 micrometers or less in size and are too small to be reliably aligned and printed with sufficient accuracy.

One method of overcoming the difficulty in depositing the wavelength-converting material only on the active, luminant, area of the light-emitting device (and not on the electrically conductive, bond pad) is to coat the light-emitting device with a layer of photoresist. This method, known as lift-off, is commonly used to reveal areas where no coating is desired. In brief, the method involves depositing a layer of photoresist over the light-emitting device, patterning the deposited layer such that the photoresist covers areas of the light-emitting device on which it is undesirable to deposit wavelength-converting material, depositing wavelength-converting material over the patterned photoresist layer, and subsequently removing the photoresist underneath the deposited wavelength-converting material such that the wavelength-converting material positioned over the photoresist is removed while the wavelength-converting material deposited on the emission surface remains in place.

Such liftoff processes often have one main prerequisite: the pattern of photoresist must cause a void, break, or vacancy in the wavelength-converting material coating, directly adjacent to the photoresist pattern. This void is necessary to allow the release material (e.g., a solvent or etchant) to attack, dissolve, and remove the photoresist (and the wavelength-converting material positioned over it). If a sufficient void or break in the wavelength-converting material layer is not produced by the underlying photoresist pattern, then the liftoff pattern generally will not perform reliably and repeatably. One method of insuring a void or break in the coating for liftoff is to produce a photoresist pattern where the sidewalls are retrograde or slanted inward. In this manner, many depositions or coatings, whether applied isotropically or anisotropically, cannot or do not deposit on the sides of the photoresist pattern, leaving a void or break in the process. This is a common method of patterning many metal or oxide coatings.

Unfortunately, most phosphor slurry coating processes are neither anisotropic nor isotropic, but are conformal. Therefore coating a photoresist pattern with a fluid, such as phosphor slurry, results in a continuous film coating without any voids or breaks, even if the underlying photoresist material has sidewalls that are retrograde or slanted inward. Accordingly, such coatings, can be extremely difficult to pattern.

One way to address the difficulties in patterning coatings of wavelength-converting materials is to adjust the ratio of wavelength-converting material to polymeric binder in the coating composition. This ratio can be adjusted until the deposited wavelength-converting material coating comprises micro-voids. The micro-voids can provide channels through which an etchant or solvent can penetrate the wavelength-converting material layer and remove the underlying photoresist, leaving behind a patterned wavelength-converting material. There are also several disadvantages associated with the micro-void coating method. For example, the micro-voids, which remain after the coating has been patterned, can cause light scattering and loss of luminous efficacy. These losses, due to light scattering, are caused by the changes in the various indices of refraction for the phosphor coating constituents, such as the wavelength-converting material (n=1.85 for typical phosphors), polymeric binder (n=1.45) and air (n=1.0).

New methods of forming patterned wavelength-converting materials have been discovered, which are described herein and which address one or more of the difficulties outlined above. In certain embodiments, patterned wavelength-converting material can be made by forming a wavelength-converting material over a mask material (such as a photoresist, which can be formed in a pattern over the external surface of the device). Subsequently, the wavelength-converting material can be removed (e.g., by grinding the wavelength-converting material) until at least a portion of the mask material is exposed. Once the mask material has been exposed, a solvent or etchant can be used to remove the mask material, and, in certain embodiments, expose an electrically conductive material (e.g., an electrically conductive bond-pad) underlying the mask material layer.

The methods described herein can be used to effectively remove wavelength-converting material without the use of sidewall breaks, microvoids, or other discontinuities in the wavelength-converting material layer. Accordingly, in certain embodiments, the wavelength-converting material layer is substantially free of discontinuities (e.g., breaks adjacent the sidewalls of the mask material, microvoids, etc.) prior to the wavelength-converting material removal step (e.g., grinding).

FIGS. 1A-1E are, according to certain embodiments, cross-sectional schematic illustrations of a process by which a wavelength-converting material can be arranged over substrate 100. Substrate 100 can assume a variety of forms. For example, in certain embodiments, substrate 100 corresponds to a light-emitting device, such as a light-emitting diode. In certain embodiments, substrate 100 corresponds to a wafer comprising multiple light-emitting devices.

In some embodiments, surface 108 of substrate 100 corresponds to an emission surface of a light-emitting device. The wavelength-converting material positioned over the substrate (described in more detail below) can thus absorb light emitted by the light-emitting device and convert the absorbed light into light of a different wavelength. In some such embodiments, exterior surface 108 of substrate 100 is part of a semiconductor layer. For example, exterior surface 108 can be part of an n-doped semiconductor layer or a p-doped semiconductor layer. In some embodiments, exterior surface 108 is part of a layer comprising a III-V semiconductor, such as GaN, InGaN, InGaAlP, AlGaN, GaAs, AlGaAs, AlGaP, GaP, GaAsP, InGaAs, InAs, InP, and combinations and alloys thereof.

In some embodiments, substrate 100 includes an electrically conductive region 101, which can be configured to transport electrical current to and/or from an electronic component associated with the substrate. For example, in certain embodiments, electrically conductive region 101 corresponds to an electrically conductive bond pad configured to transport electrical current to and/or from a light-emitting device associated with substrate 100. The use of substrates with electrically conductive regions positioned over them is optional, and in other embodiments, no electrically conductive regions are present over the substrate. Electrically conductive region can be formed of any suitable material. For example, in certain embodiments, all or part of electrically conductive region 101 is formed of a metal (e.g., gold, silver, tantalum, copper, aluminum, or any other suitable metal). In certain embodiments, all or part of electrically conductive region 101 is formed of a conductive oxide, such as indium tin oxide, aluminum zinc oxide, and the like. In some embodiments, electrically conductive region 101 can have a bulk electrical resistivity at 20° C. of about $10^{-5}$ $\Omega \cdot m$ or less, about $10^{-6}$ $\Omega \cdot m$ or less, or about $10^{-7}$ $\Omega \cdot m$ or less (and/or, in certain embodiments, down to about $10^{-8}$ $\Omega \cdot m$, down to about $10^{-9}$ $\Omega \cdot m$, or down to about $10^{-10}$ $\Omega \cdot m$).

In FIG. 1A, mask material 102 is positioned over substrate 100. While the figures illustrate mask material 102 that is in direct contact with the substrate, it should be understood that, in other embodiments, one or more intermediate materials can be positioned between the mask material and the substrate.

A variety of materials can be used as mask material 102. In certain embodiments, mask material 102 is electrically non-conductive. For example, the mask material can be an electrical insulator or a semiconductor. In certain embodiments, the mask material is an electrically non-conductive polymer, such as a photoresist or other polymeric material. In some embodiments, the mask material is an oxide of a metal (e.g., an aluminum oxide), and oxide of a metalloid (e.g., a silicon oxide), a nitride of a metal, or a nitride of a metalloid (e.g., a silicon nitride). In some embodiments, the mask material has a bulk electrical resistivity at 20° C. of at least about 0.1 $\Omega \cdot m$, at least about 100 $\Omega \cdot m$, at least about $10^5$ $\Omega \cdot m$, at least about $10^9$ $\Omega \cdot m$, at least about $10^{13}$ $\Omega \cdot m$, at least about $10^{17}$ $\Omega \cdot m$ (and/or, in certain embodiments, up to about $10^{20}$ $\Omega \cdot m$, up to about $10^{25}$ $\Omega \cdot m$ or up to about $10^{30}$ $\Omega \cdot m$).

In certain embodiments, mask material 102 is non-metallic. In certain embodiments, all or part of mask material 102 can be formed of a polymeric material. For example, a polymeric photoresist can be used as a mask material. The photoresist material can be a positive resist (wherein the portion of the photoresist that is exposed to light becomes soluble to the photoresist developer) or a negative resist (wherein the portion of the photoresist that remains unexposed remains soluble to the photoresist developer). Exemplary photoresist materials suitable for use in association with the embodiments described herein include, but are not limited to, photoresists based on poly(methyl methacrylate) (PMMA), poly(methyl glutarimide) (PMGI), phenol formaldehyde resin (e.g., those containing Diazonaphthoquinone (DNQ), Novolac, etc.), and epoxy-based photoresists (e.g., SU-8).

The use of photoresists and other electrically non-conductive and/or non-metal materials as mask materials can be particularly advantageous, in certain embodiments. For example, photoresist can be easily integrated into existing cleanroom processes, unlike materials such as solder, which generally need to be applied during packaging and outside the cleanroom. In addition, photoresist materials are generally very inexpensive compared to metal materials. Also, photoresist materials can be removed from substrates and contact pads relatively easily, for example, using solvents that are chemically benign to selectively dissolve the photoresist.

In certain embodiments, mask material 102 can be metallic. For example, mask material 102 can comprise copper. In some such embodiments, electrically conductive region 101 can comprise gold, in which case, the copper within mask material 102 can be selectively dissolved using, for example, ferric ammonium nitrate or ferric ammonium sulfate. Mask material 102 can comprise any other metal material (e.g., tantalum, gold, chrome, or any other suitable metal) that can be selectively removed to leave behind electrically conductive region 101 and wavelength-converting material 110.

Mask material 102 can be formed over substrate 100 using a variety of suitable methods. For example, mask material 102 can be formed over substrate 100 via spin-coating, spray-coating, slot-coating, sputtering, evaporation (e.g., metal evaporation), and the like.

In some embodiments, mask material 102 can be formed over substrate 100 as a thin film. For example, metal mask material can be formed over a substrate via evaporative deposition, sputtering, or via any other suitable method. Non-metallic mask materials can be formed in thin films using, for example, spin-coating, spray-coating, and the like. In some embodiments, mask layer 102 can have an average thickness of less than about 1 mm, less than about 100 micrometers, less than about 10 micrometers, or less than about 1 micrometer (and/or down to about 10 nm or down to about 1 nm, in certain embodiments). The average thickness of a given layer can be determined by number averaging thicknesses of the layer over a representative number of sampling points.

Figure 1C:
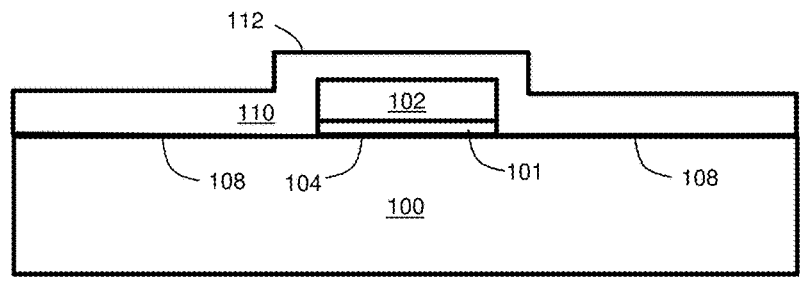

In certain embodiments, including the set of embodiments illustrated in FIG. 1C, mask material 102 can be present as a substantially conformal coating over substrate 100. The mask material can be present as a layer positioned over the substrate, optionally forming a conformal layer that covers an entire external surface of the substrate. For example, in FIG. 1A, mask material 102 forms a substantially conformal layer over external surface 108 of substrate 100. The invention is not limited to embodiments in which the mask material forms a conformal coating, and in other embodiments, the thickness of the mask material can vary as a function of position over the substrate.

Mask material 102 can be patterned to cover areas of the substrate on which it is not desired to deposit wavelength-converting material. For example, in FIG. 1B, mask material 102 is formed in a pattern such that the mask material covers first portion 104 of exterior surface 106 of substrate 100 and the mask material does not cover second portion 108 of exterior surface 106 of substrate 100. Mask material 102 can be patterned using a variety of suitable methods, including dissolving the mask material, etching the mask material, and the like. For example, in certain embodiments, all or part of mask material 102 can be formed of a photoresist material, and the photoresist material can be patterned using standard photoresist development techniques (e.g., exposure to electromagnetic radiation to cross-link a portion of the photoresist and subsequent dissolution of the non-cross-linked portion with a developer). In some embodiments, all or part of mask material 102 can be formed of a metal, and the metal layer can be patterned using standard photolithography techniques.

In some embodiments, a wavelength-converting material can be positioned over substrate 100. In FIG. 1C, for example, wavelength-converting material 110 is positioned over substrate 100 and mask material 102. Wavelength-converting material 110 can be positioned over mask material 102 as well as second portion 108 of exterior surface 106 of substrate 100. In FIG. 1C, the wavelength-converting material is in direct contact with mask material 102 and the portions of substrate 100 over which no mask material has been positioned. In other embodiments, however, one or more intermediate materials can be positioned between the wavelength-converting material and the substrate and/or between the wavelength-converting material and the mask material.

In some embodiments, the wavelength-converting material comprises one or more phosphors, such as one or more types of phosphor particles (e.g., yellow phosphor, red phosphor, green phosphor, etc.). In some embodiments, the wavelength-converting material comprises nanoparticles.

Wavelength-converting material 110 can be formed over substrate 100 and mask material 102 using a variety of suitable methods. In certain embodiments, the wavelength-converting material can be mixed with a binder material and subsequently deposited. Suitable deposition methods include, but are not limited to, spin-coating, spray-coating, slot-coating, jetting, ink-jet printing, and screen printing, among other methods. In one set of embodiments, the wavelength-converting material can be mixed with a spin-on-glass (SOG) material (e.g., Futurrex, IC1-200) and subsequently deposited over the substrate. In some embodiments, the wavelength-converting material (e.g., in particulate form) may be mixed with silicones and/or epoxy and subsequently deposited over the substrate. In some embodiments, no silicone material and/or no epoxy material is present in this process.

In some cases, the binder material may be selected to have a viscosity that is favorable in light of the deposition method selected (e.g., spin coating, etc.). The viscosity of the binder may also be tailored, in some cases, via pretreatment before mixing with the wavelength-converting material. In one set of embodiments, a mixture of wavelength-converting material powder (e.g., YAG:Ce powder with average particle size of 1-10 micrometers, which can be obtained from Phosphor Technology Corp.) and SOG (e.g., in a ratio of between 0.1 g:1 mL to 2 g:1) can be applied to wafers. Other mixing ratios that are greater than or less than this range is also possible.

In certain embodiments, including the set of embodiments illustrated in FIG. 1C, wavelength-converting material 110 can be present as a substantially conformal coating over mask material 102 and/or substrate 100. In some such embodiments, the wavelength-converting material can be present as a layer of material that covers mask material 102 and/or substrate 100. In other embodiments, the thickness of the wavelength-converting material can vary as a function of position over the substrate.

In some embodiments, a portion of the wavelength-converting material can be removed. The portion of the wavelength-converting material can be removed, in some embodiments, before a substantial portion (e.g., 5% or more) of the mask material is removed, in contrast with lift-off processes, in which the mask material and the wavelength-converting material are removed in a single step by applying a solvent or etchant to the mask material and lifting off the wavelength-converting material. In certain embodiments, at least a portion or substantially all of the wavelength-converting material that is positioned over the mask material can be removed before 50% or more, before 25% or more, before 10% or more, or before 5% or more of the mask material positioned under the wavelength-converting material is removed. In certain embodiments, at least a portion or substantially all of the wavelength-converting material that is positioned over the mask material can be removed before any of the mask material positioned under the wavelength-converting material is removed.

In some such embodiments, wavelength-converting material is removed such that wavelength-converting material is no longer positioned over at least a portion of the mask material. In addition, wavelength-converting material can be removed such that at least a portion of the wavelength-converting material remains positioned over the second portion of the exterior surface of the substrate (i.e., the portion of the exterior surface of the substrate over which mask material was not positioned). For example, in FIG. 1D, the portions of the wavelength-converting material 110 that were positioned over mask material 102 have been substantially completely removed such that wavelength-converting material is no longer positioned over mask material 102. In addition, in FIG. 1D, after removal of the portion of wavelength-converting material 110, wavelength-converting material remains positioned over substantially all of second portions 108 of exterior surface 106 of substrate 100.

Figure 1D:
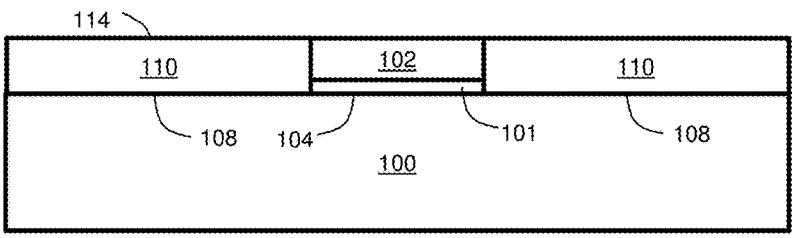
Figure 1E:
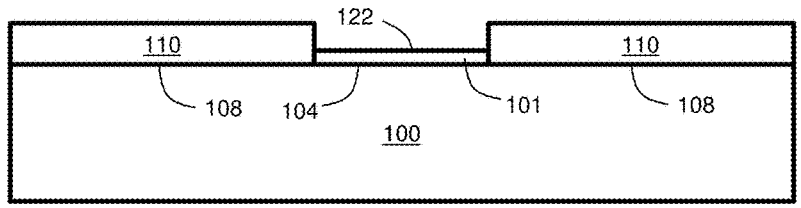

While substantially complete removal of wavelength-converting material 110 from over mask material 102 and substantially complete residual coverage of second portions 108 by wavelength-converting material 110 are illustrated in FIG. 1D, it should be understood that, in other embodiments, wavelength-converting material can be removed such that some residual wavelength-converting material remains positioned over the mask material and/or such that some of the second portions of the substrate remain covered by some residual wavelength-converting material.

Wavelength-converting material 110 can be removed using a variety of suitable methods. In some embodiments, the wavelength-converting material can be removed first at its exterior surface (e.g., surface 112 in FIG. 1C), and subsequently within the bulk as the bulk wavelength-converting material is exposed. For example, in certain embodiments, removing the wavelength-converting material comprises grinding the wavelength-converting material. Grinding can be achieved, for example, by applying an abrasive material that is fixed on a surface (e.g., a grinding wheel, a file, sandpaper, etc.) to exterior surface 112 of wavelength-converting material 110, and moving the abrasive material relative to exterior surface 112. For example, in one set of embodiments, a grinding wheel comprising diamond particles on its exterior surface can be rotated and brought into contact with exterior surface 112 of wavelength-converting material 110. In certain embodiments, a loose abrasive (e.g., particles of abrasive material, such as diamond particles) can be applied in loose form to exterior surface 112 of wavelength-converting material 110, and a moveable surface (e.g., a pad) can be used to grind away wavelength-converting material. In some such embodiments, the loose abrasive material can be suspended in a fluid to form a slurry that can be applied to the exterior surface of the wavelength-converting material. In certain embodiments, both a loose abrasive material (optionally in slurry form) and a fixed abrasive material (e.g., on a grinding wheel) can be used to remove wavelength-converting material.

In some embodiments, removing a portion of the wavelength-converting material can result in one forming a substantially planar surface across the wavelength-converting material and the mask material. For example, in FIG. 1D, wavelength converting material 110 has been removed such that substantially flat external surface 114 has been formed across mask material 102 and wavelength-converting material 110.

Figure 2A:
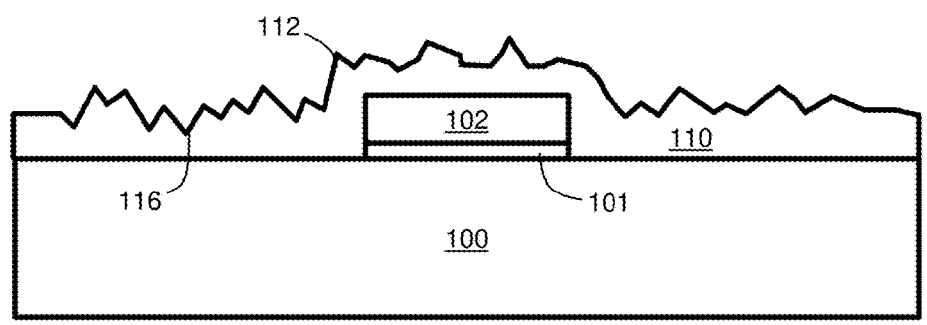
FIGS. 2A-2C are, according to certain embodiments, cross-sectional schematic illustrations of a process in which wavelength-converting material is removed to form a layer with a substantially uniform thickness.
Figure 2B:
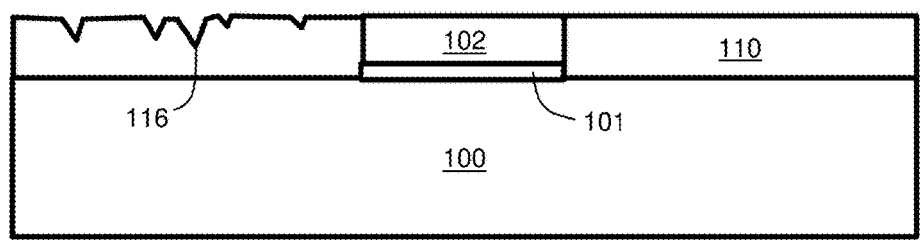
Figure 2C:
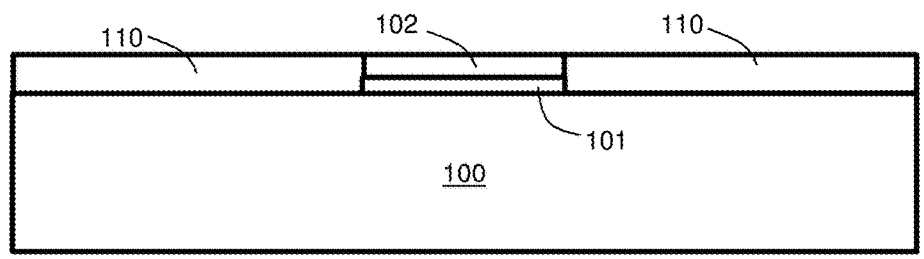

One advantage of the wavelength-converting material removal process described herein is that any non-uniformity in the thickness of the wavelength-converting material can be reduced or eliminated by removing the wavelength-converting material until a uniformly-thick layer is present. This can be achieved, for example, by removing the wavelength-converting material to a level at or below the minimum thickness of the wavelength-converting material that is present after formation of the wavelength-converting material layer. This concept is illustrated in FIGS. 2A-2C. In FIG. 2A, external surface 112 is rough, leading to a non-uniform thickness of wavelength-converting material 110. The minimum thickness of the wavelength-converting material in FIG. 2A occurs at point 116. After a first portion of wavelength-converting material has been removed (resulting in the structure illustrated in FIG. 2B), the thickness of the wavelength-converting material remains non-uniform because the thickness at point 116 (as well as several other points) is thinner than the thickness elsewhere across substrate 100. To achieve a substantially uniform thickness of wavelength-converting material, additional removal of the wavelength-converting material (and removal of a portion of mask material 102) can be performed, resulting in the structure illustrated in FIG. 2C.

While FIGS. 2B-2C illustrate a set of embodiments in which removal of wavelength-converting material 110 is finished before removal of mask material 102, it should be understood that, in other embodiments, mask material 102 can be removed prior to completing the step of smoothening wavelength-converting material 110. For example, in some embodiments, after a portion of wavelength-converting material 110 is removed to produce the device shown in FIG. 2B, mask material 102 can be at least partially (e.g., completely) removed, after which, wavelength-converting material 110 can be further removed to form the device illustrated in FIG. 2C.

Another advantage of the wavelength-converting material removal process described herein is that the color temperature of the light emitted from the wavelength-converting material can be relatively easily controlled by controlling the thickness of the wavelength-converting material. In traditional lift-off processes the final thickness of the wavelength-converting material is generally set by the original thickness of the as-deposited wavelength-converting material. In the processes described herein, on the other hand, the thickness of the wavelength-converting material can be controlled by adjusting the initial thickness of the wavelength-converting material as well as by adjusting the extent to which the wavelength-converting material is subsequently removed. Thus, fabrication of devices that emit light over a variety of color temperatures can be achieved simply by adjusting the degree to which wavelength-converting material is removed from the device (e.g., via grinding).

In certain embodiments, after at least a portion of the wavelength-converting material has been removed, the thickness of the wavelength-converting material can be substantially constant across a device and/or a wafer of devices. For example, in some embodiments, the thicknesses of the wavelength-converting layer at the thinnest and thickest points can be less than about 100%, less than about 50%, less than about 25%, less than about 10%, or less than about 5% different than the average thickness of the wavelength-converting material.

In some embodiments, at least a portion (or substantially all) of the mask material can be removed from the substrate after a portion (or substantially all) of the wavelength-converting material positioned over the mask material has been removed. For example, in FIG. 1E, mask material 102 has been removed from substrate 100, leaving behind wavelength-converting material 110 positioned over portions 108 of substrate 100, and substantially no material positioned over portion 104 of substrate 100. Removal of the mask material can result in exposure of at least a portion of an external surface of electrically conductive region 101, which can be, for example, an electrical contact (e.g., an electrical contact of a light-emitting device such as an LED).

Mask material 102 can be removed using a variety of suitable methods. For example, mask material can be removed via exposure to a solvent or etchant, via combustion or pyrolysis of the mask material, or via any other suitable method. In some embodiments, the removal technique can be selected such that mask material 102 is removed without substantially removing or otherwise damaging underlying substrate 100, electrically conductive region 101, or wavelength-converting material 110. For example, a selective solvent or etchant can be used that, while removing mask material 102, does not remove or otherwise damage substrate 100, electrically conductive region 101, or wavelength-converting material 110.

In some embodiments, electrically conductive materials such as those used to form bond pads can be protected during the processes described herein. For example, in FIGS. 1A-1E, mask material 102 is used to cover electrically conductive region 101 such that wavelength-converting material 110 does not come into direct contact with the top surface of the electrically conductive material. After the removal of the portion of the wavelength-converting material and removal of the mask material, an exposed surface 122 of electrically conductive region 101 can be formed. In certain embodiments, substantially no wavelength-converting material is present over the top surface of the electrically conductive material after the mask material is removed. Such methods can be especially useful when processing light-emitting devices. In some such processes, the arrangement of the wavelength-converting material can be controlled such that the wavelength-converting material only covers the emission surface of the light-emitting device, leaving uncovered electrical contacts that can be easily accessed by electrical leads.

While FIGS. 1A-1E outline several process steps used to form wavelength-converting material over a substrate, it should be understood that not all of these steps are required as part of the inventive process. For example, in certain embodiments, the inventive process may include the step of forming the mask material over the substrate. In other embodiments, however, the substrate may be acquired (e.g., from a third-party vendor, or another source) with the mask material already deposited over the substrate. Similarly, in certain embodiments, the step of removing at least a portion of the mask material from the substrate such that the mask material does not cover the second portion of the exterior surface of the substrate is performed. However, in other embodiments, the substrate may be acquired with the mask material already formed in the desired pattern, thereby eliminating the need to perform the mask material removal step. As yet another example, inventive methods can include the step of forming the wavelength-converting material over the mask material and the exterior surface of the substrate. In other embodiments, however, the substrate may be acquired with the mask material and the wavelength-converting material already positioned over the substrate (e.g., the substrate may be acquired in the state illustrated in FIG. 1C).

As noted above, the methods described herein can be used in association with a variety of devices, including light-emitting devices. In some embodiments, wavelength-converting material layer is deposited on and/or removed from (e.g., via grinding) a wafer that is subsequently processed to form multiple light-emitting devices, for example, by cutting the wafer to form multiple dice. Such methods can shorten the device fabrication cycle time and minimize discrepancies in desired optical properties after wavelength conversion, such as CIE coordinates and CCT. In other embodiments, individuated light-emitting device dice can be processed using the methods described herein.

Figure 3:
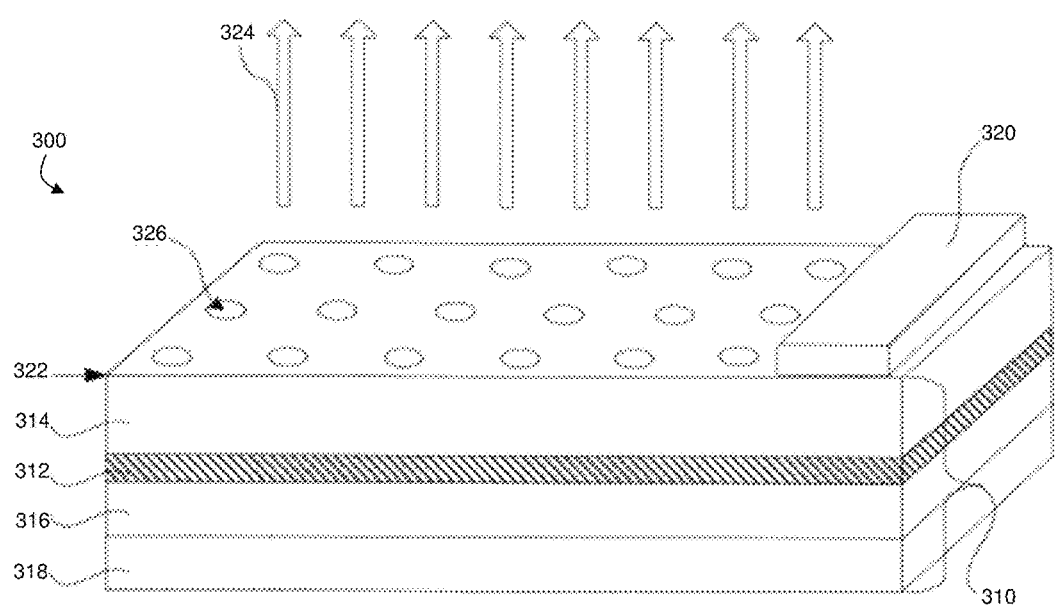
FIG. 3 is a schematic illustration of a light-emitting device die that can be used in association with certain embodiments.

FIG. 3 illustrates a light-emitting die 300 that can include a light-emitting diode (LED) that may be used in connection with the embodiments described above. It should be understood that various embodiments presented herein can also be applied to other light-emitting dies, such as laser diode dies, and LED dies having different structures (such as organic LEDs, also referred to as OLEDs). All or a portion of light-emitting die 300 in FIG. 3 can be used as substrate 100 in FIGS. 1A-1E or FIGS. 2A-2C.

LED die 300 shown in FIG. 3 comprises a multi-layer stack 310 that may be disposed on a support structure (not shown), such as a submount (e.g., a metal submount). The multi-layer stack 310 can include an active region 312, which can be configured to generate light within the light-emitting device. Active region 312 can be formed between n-doped layer(s) 314 and p-doped layer(s) 316. The stack can also include an electrically conductive layer 318 which may serve as a p-side contact and/or as an optically reflective layer. An n-side contact pad 320 (which can correspond to electrically conductive region 101 in FIGS. 1A-1E) may be disposed on layer 314. Electrically conductive fingers (not shown) and/or a current spreading layer (e.g., transparent conductive layer, such as a transparent conductive oxide) may extend from the contact pad 320 and along light emission surface 322 (which can correspond to surface 106 in FIGS. 1A-1E), thereby allowing for uniform current injection into the LED structure.

It should be appreciated that the LED is not limited to the configuration shown in FIG. 3, for example, the n-doped and p-doped sides may be interchanged so as to form a LED having a p-doped region in contact with contact pad 320 and an n-doped region in contact with layer 318.

As described further below, electrical potential may be applied to the contact pads which can result in light generation within active region 312 and emission (represented by arrows 324) of at least some of the light generated through light emission surface 322. As described further below, holes 326 may be defined in an emission surface to form a pattern that can influence light emission characteristics, such as light extraction and/or light collimation. It should be understood that other modifications can be made to the representative LED structure presented, and that embodiments are not limited in this respect.

The active region of an LED can include one or more quantum wells surrounded by barrier layers. The quantum well structure may be defined by a semiconductor material layer (e.g., in a single quantum well), or more than one semiconductor material layers (e.g., in multiple quantum wells), with a smaller electronic band gap as compared to the barrier layers. Suitable semiconductor material layers for the quantum well structures can include InGaN, AlGaN, GaN and combinations of these layers (e.g., alternating InGaN/GaN layers, where a GaN layer serves as a barrier layer). In general, LEDs can include an active region comprising one or more semiconductors materials, including III-V semiconductors (e.g., GaAs, AlGaAs, AlGaP, GaP, GaAsP, InGaAs, InAs, InP, GaN, InGaN, InGaAlP, AlGaN, as well as combinations and alloys thereof), II-VI semiconductors (e.g., ZnSe, CdSe, ZnCdSe, ZnTe, ZnTeSe, ZnS, ZnSSe, as well as combinations and alloys thereof), and/or other semiconductors. Other light-emitting materials are possible such as quantum dots or organic light-emission layers.

The n-doped layer(s) 314 can include a silicon-doped GaN layer (e.g., having a thickness of about 4000 nm thick) and/or the p-doped layer(s) 316 can include a magnesium-doped GaN layer (e.g., having a thickness of about 40 nm thick). The electrically conductive layer 318 may be a reflective layer, such as a silver-containing layer (e.g., having a thickness of about 100 nm), which may reflects upwards any downward propagating light generated by the active region 312. Furthermore, although not shown, other layers may also be included in the LED; for example, an AlGaN layer may be disposed between the active region 312 and the p-doped layer(s) 316. It should be understood that compositions other than those described herein may also be suitable for the layers of the LED.

In some embodiments, a layer of the LED may have a dielectric function that varies spatially according to a pattern. For example, in FIG. 3, as a result of holes 326, LED 300 has a dielectric function across emission surface 322 that varies spatially according to a pattern. Typical hole sizes can be less than about one micron (e.g., less than about 750 nm, less than about 500 nm, less than about 250 nm) and typical nearest neighbor distances between holes can be less than about one micron (e.g., less than about 750 nm, less than about 500 nm, less than about 250 nm). Furthermore, as illustrated in FIG. 3, holes 326 can be non-concentric.

The dielectric function that varies spatially according to a pattern can influence the extraction efficiency and/or collimation of light emitted by the LED. In the illustrative LED die of FIG. 3, the pattern is formed of holes, but it should be appreciated that the variation of the dielectric function at an interface need not necessarily result from holes. Any suitable way of producing a variation in dielectric function according to a pattern may be used. The pattern may be periodic (e.g., having a simple repeat cell, or having a complex repeat super-cell), or non-periodic. As referred to herein, a complex periodic pattern is a pattern that has more than one feature in each unit cell that repeats in a periodic fashion. Examples of complex periodic patterns include honeycomb patterns, honeycomb base patterns, (2×2) base patterns, ring patterns, and Archimedean patterns. In some embodiments, a complex periodic pattern can have certain holes with one diameter and other holes with a smaller diameter. As referred to herein, a non-periodic pattern is a pattern that has no translational symmetry over a unit cell that has a length that is at least 50 times the peak wavelength of light generated by one or more light-generating portions. As used herein, peak wavelength refers to the wavelength having a maximum light intensity, for example, as measured using a spectroradiometer. Examples of non-periodic patterns include aperiodic patterns, quasi-crystalline patterns (e.g., quasi-crystal patterns having 8-fold symmetry), Robinson patterns, and Amman patterns. A non-periodic pattern can also include a detuned pattern (as described in U.S. Pat. No. 6,831,302 by Erchak, et al., which is incorporated herein by reference in its entirety). In some embodiments, the LED may include a roughened surface. In some cases, the LED may include a surface that is roughened but not patterned.

In certain embodiments, an interface of a light-emitting device is patterned with holes which can form a photonic lattice. Suitable LEDs having a dielectric function that varies spatially (e.g., a photonic lattice) have been described in, for example, U.S. Pat. No. 6,831,302, entitled "Light emitting devices with improved extraction efficiency," filed on Nov. 26, 2003, which is herein incorporated by reference in its entirety. A high extraction efficiency for an LED implies a high power of the emitted light and hence high brightness which may be desirable in various optical systems.

Light may be generated by the LED as follows. The p-side contact layer can be held at a positive potential relative to the n-side contact pad, which causes electrical current to be injected into the LED. As the electrical current passes through the active region, electrons from n-doped layer(s) can combine in the active region with holes from p-doped layer(s), which can cause the active region to generate light. The active region can contain a multitude of point dipole radiation sources that generate light with a spectrum of wavelengths characteristic of the material from which the active region is formed. For InGaN/GaN quantum wells, the spectrum of wavelengths of light generated by the light-generating region can have a peak wavelength of about 445 nanometers (nm) and a full width at half maximum (FWHM) of about 30 nm, which is perceived by human eyes as blue light. The light emitted by the LED may be influenced by any patterned surface through which light passes, whereby the pattern can be arranged so as to influence light extraction and/or collimation.

In other embodiments, the active region can generate light having a peak wavelength corresponding to ultraviolet light (e.g., having a peak wavelength of about 370-390 nm), violet light (e.g., having a peak wavelength of about 390-430 nm), blue light (e.g., having a peak wavelength of about 430-480 nm), cyan light (e.g., having a peak wavelength of about 480-500 nm), green light (e.g., having a peak wavelength of about 500 to 550 nm), yellow-green (e.g., having a peak wavelength of about 550-575 nm), yellow light (e.g., having a peak wavelength of about 575-595 nm), amber light (e.g., having a peak wavelength of about 595-605 nm), orange light (e.g., having a peak wavelength of about 605-620 nm), red light (e.g., having a peak wavelength of about 620-700 nm), and/or infrared light (e.g., having a peak wavelength of about 700-1200 nm).

In certain embodiments, the LED may emit light having a high light output power. As described above, the high power of emitted light may be a result of a pattern that influences the light extraction efficiency of the LED. For example, the light emitted by the LED may have a total power greater than 0.5 Watts (e.g., greater than 1 Watt, greater than 5 Watts, or greater than 10 Watts). In some embodiments, the light generated has a total power of less than 100 Watts, though this should not be construed as a limitation of all embodiments. The total power of the light emitted from an LED can be measured by using an integrating sphere equipped with spectrometer, for example a SLM12 from Sphere Optics Lab Systems. The desired power depends, in part, on the optical system that the LED is being utilized within.

The light generated by the LED may also have a high total power flux. As used herein, the term "total power flux" refers to the total optical power divided by the light emission area. In some embodiments, the total power flux is greater than 0.03 Watts/mm$^2$, greater than 0.05 Watts/mm$^2$, greater than 0.1 Watts/mm$^2$, or greater than 0.2 Watts/mm$^2$. However, it should be understood that the LEDs used in systems and methods presented herein are not limited to the above-described power and power flux values.

In some cases, it may be preferable for at least one of the edges of the light-emitting device to be relatively large. For example, in certain embodiments, at least one of the edges of the light-emitting device is at least about 1 mm, at least about 1.5 mm, at least about 2 mm, at least about 2.5 mm, at least about 3 mm, or at least about 5 mm. In some embodiments, more than one edge (e.g., all edges) of the light-emitting device have the edge lengths noted above. Such dimensions lead to LEDs, and emission surfaces, having large areas. For example, in some cases, the surface area of the emission surface may be at least about 1 mm$^2$, at least about 2.5 mm$^2$, at least about 5 mm$^2$, or at least about 10 mm$^2$. The techniques described herein may be well-suited for use with large area LEDs. However, it should be understood that the techniques are not limited in this regard.

In certain embodiments, the light-emitting device can be configured to emit most or all of the light generated by active region 312 through emission surface 322. Such light-emitting devices are commonly referred to as "top-emitting" (as opposed to "side-emitting") light-emitting devices. In certain embodiments, at least about 75%, at least about 90%, at least about 95%, at least about 99%, or substantially all of the light that is emitted by the light-emitting device is emitted through the emission surface (e.g., a top emission surface such as emission surface 322 in FIG. 3).

As noted above, wavelength-converting materials can be formed over a light-emitting device to convert emitted light of a first wavelength to light of a second, different wavelength. A variety of materials can be used as wavelength-converting materials in the embodiments described herein. In some preferred embodiments, the wavelength-converting material includes a phosphor material. The phosphor material can be present, for example, in particulate form. The phosphor particles may be distributed in a second material (e.g., an encapsulant or adhesive, such as epoxy) to form a composite structure.

Any suitable phosphor material may be used. In some embodiments, the phosphor material may be a yellow phosphor material (e.g., $(Y,Gd)(Al,Ga)G:Ce^{3+}$, sometimes referred to as a "YAG" (yttrium, aluminum, garnet) phosphor), a red phosphor material (e.g., $L_2O_2S:Eu^{3+}$), a green phosphor material (e.g., ZnS:Cu,Al,Mn), and/or a blue phosphor material (e.g., $(Sr,Ca,Ba,Mg)_{10}(PO_4)_6Cl:Eu^{2+}$). Other phosphor materials are also possible. Suitable phosphor materials have been described, for example, in U.S. Pat. No. 7,196,354, filed Sep. 29, 2005, entitled "Wavelength-converting Light-emitting Devices," by Erchak, et al., which is incorporated herein by reference in its entirety.

In some embodiments, the average particle size of the wavelength-converting powder may be less than 100 micrometers. In some embodiments, the average particle size is less than 30 micrometers. In some embodiments, the average particle size of the wavelength-converting material powder may be between about 1 and 10 micrometers, between about 4 and 16 micrometers, between about 10 and 30 micrometers, or between about 30 and 100 micrometers. It should be understood that particle size ranges other than those described herein may also be used.

In addition, the ratio of wavelength-converting material to binder may vary. For example, the ratio of wavelength-converting material to binder may be at least about 0.1 g/mL, at least 0.5 g/mL, at least 1 g/mL, at least 2 g/mL, or higher. Good uniformity and thickness can be obtained using spin-coating processes that are well-known for use with other materials. Dense films may be obtained as shown by SEM images showing that the wavelength-converting material particles are densely packed. Pre-baked S-O-G can serve as a strong binding material. In some embodiments, wafers can undergo quick dump rinsing, spin rinse drying, and/or laser dicing without substantial wavelength-converting material loss.

In some embodiments, more than one layer of wavelength-converting material may be deposited (e.g., multiple layers of the same color, multiple layers each with a unique color, etc.). When multiple layers are present, the layer(s) may have one or more different type of wavelength-converting material than the other layer(s).

It should be noted that additional phosphor materials may be added, in some embodiments, during post-processing packaging. For example, in the case of a device which requires one or more phosphors, minor tuning with a single phosphor may be performed at the package level. In the case of a device which requires multiple phosphors (e.g. a majority of yellow phosphor with a small quantity of a red phosphor to improve the color rendering index of the final device) one phosphor (e.g., the yellow phosphor) could be applied at the wafer level and the other phosphor (e.g., the red phosphor) could be applied in small quantity at the package level. Similarly, additional materials may be added, in some embodiments, on top of the coating at the wafer level, according to the "multi-layer" approach described in the preceding paragraph.

The temperature of the wavelength-converting material may be controlled relatively easily, in some embodiments, due to the proximity of the wavelength-converting material layer to the die. Many binder materials have lower thermal conductivities than GaN. Therefore, the proximity of the wavelength-converting material layer to the die allows for a relatively lower temperature of operation in the wavelength-converting material layer.

The methods described herein are compatible with etendue-limited dice (without a lens) and with non-etendue-limited dice (with a lens). Generally, relatively thicker wavelength-converting material layers are applied to dice in which lenses are to be applied, while relatively thinner wavelength-converting material layers are applied to dice in which no lenses are to be applied. A lens may be added to the die at any time after the deposition of the wavelength-converting material layer, including after the phosphor coated die has been packaged.

The methods described herein can provide several advantages over other wavelength-converting material deposition methods. For example, the methods described herein do not require a set ratio of wavelength-converting material to polymeric binder in the initial mix. This can allow one to adjust the ratio of wavelength-converting material to polymeric binder to achieve a desired color output. Another advantage of the methods described herein is that the coating uniformity of the wavelength-converting material can be controlled—both across an individual die and across a wafer comprising multiple dice—allowing for a high-yield, repeatable manufacturing process.

The systems and methods described herein also allow for the alignment of patterns on the wafer using existing fabrication equipment that is already used for many common LED fabrication processes, thus eliminating the need for costly equipment upgrades.

Another advantage of the systems and methods described herein is that the same die design die (e.g., color, size, etc.) can be used in multiple package configurations (e.g., chip-on-board, surface-mount, multi-chip package, etc.) without the need to develop a unique assembly infrastructure for phosphor deposition and control for each package configuration, thus reducing costs.

As used herein, when a structure (e.g., layer, region) is referred to as being "on", "over" "overlying" or "supported by" another structure, it can be directly on the structure, or an intervening structure (e.g., layer, region) also may be present. A structure that is "directly on" or "in contact with" another structure means that no intervening structure is present.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

What is claimed is:

1. A method, comprising:
   providing a substrate over which a mask material and a wavelength-converting material are positioned, wherein:
   the mask material covers only an electrical contact on an exterior surface of the substrate,
   the mask material does not cover portions of the exterior surface of the substrate that do not include the electric contact formed thereon, and
   the wavelength-converting material is positioned over the mask material and the portions of the exterior surface of the substrate that do not include the electrical contact formed thereon;
   removing a portion of the wavelength-converting material such that wavelength-converting material is no longer positioned over an entire top surface of the mask material and at least a portion of the wavelength-converting material remains positioned over the portions of the exterior surface of the substrate that do not include the electrical contact formed thereon, wherein removing the portion of the wavelength-converting material comprises grinding the wavelength-converting material, wherein a thickness of a first section of the wavelength-converting material is thinner than a thickness of a second section of the wavelength-converting material after the removing the portion of the wavelength-converting material; and
   partially removing at least a portion of the mask material and a second portion of the wavelength-converting material to form a substantially planar surface across the mask material and the wavelength-converting material.

2. The method of claim 1, comprising forming the mask material over the substrate.

3. The method of claim 2, comprising, after forming the mask material over the substrate, removing at least a portion of the mask material from the substrate such that the mask material does not cover the second portion of the exterior surface of the substrate.

4. The method of claim 1, comprising forming the wavelength-converting material over the mask material and the second portion of the exterior surface of the substrate.

5. The method of claim 1, wherein removing the portion of the wavelength-converting material comprises forming a substantially planar surface across the wavelength-converting material and the mask material.

6. The method of claim 1, wherein the mask material comprises a polymer.

7. The method of claim 1, wherein the mask material comprises a photoresist.

8. The method of claim 1, wherein the wavelength-converting material comprises at least one phosphor.

9. The method of claim 1, wherein removing at least a portion of the mask material exposes a surface of an electrically conductive material underneath the mask material.

10. The method of claim 1, wherein the substrate comprises a light-emitting device.

11. The method of claim 10, wherein the light-emitting device comprises a light-emitting diode.

12. The method of claim 10, wherein the light-emitting device has an edge having a length of at least about 1 mm.

13. The method of claim 10, wherein the exterior surface corresponds to an emission surface of the light-emitting device, and at least about 75% of the light that is emitted by the light-emitting device is emitted through the exterior surface.

14. The method of claim 1, wherein substantially none of the electrical contact is covered by the wavelength-converting material.

15. The method of claim 1, wherein the exterior surface is part of a semiconductor layer.

16. The method of claim 15, wherein the semiconductor layer comprises an n-doped semiconductor layer.

* * * * *